(12) United States Patent
Robinson (10) Patent No.: US 11,088,494 B2
(45) Date of Patent: Aug. 10, 2021

(54) HIGH SPEED COMMUNICATION JACK

(71) Applicant: Sentinel Connector Systems, Inc., York, PA (US)

(72) Inventor: Brett D. Robinson, Mesa, AZ (US)

(73) Assignee: Sentinel Connector Systems, Inc., York, PA (US)

( * ) Notice: Subject to any disclaimer, the term of this patent is extended or adjusted under 35 U.S.C. 154(b) by 0 days.

(21) Appl. No.: 16/681,458

(22) Filed: Nov. 12, 2019

(65) Prior Publication Data

US 2020/0083652 A1  Mar. 12, 2020

Related U.S. Application Data

(63) Continuation of application No. 16/192,139, filed on Nov. 15, 2018, now Pat. No. 10,483,702, which is a
(Continued)

(51) Int. Cl.

| | |
|---|---|
| *H01R 13/64* | (2006.01) |
| *H01R 13/646* | (2011.01) |
| *H01R 43/20* | (2006.01) |
| *H01R 13/6474* | (2011.01) |
| *H01R 13/7195* | (2011.01) |

(Continued)

(52) U.S. Cl.
CPC ....... *H01R 13/646* (2013.01); *H01R 13/6474* (2013.01); *H01R 13/6625* (2013.01); *H01R 13/7195* (2013.01); *H01R 43/205* (2013.01); *H05K 1/0218* (2013.01); *H05K 1/0228* (2013.01); *H05K 1/09* (2013.01); *H05K 1/115* (2013.01); *H05K 1/162* (2013.01); *H01R 13/6581* (2013.01); *H01R 13/6658* (2013.01); *H01R 24/64* (2013.01);
(Continued)

(58) Field of Classification Search
CPC .................................................. H01R 13/6466
See application file for complete search history.

(56) References Cited

U.S. PATENT DOCUMENTS

| | | |
|---|---|---|
| 6,250,968 B1 | 6/2001 | Winings |
| 6,663,423 B2 | 12/2003 | Belopsky et al. |

(Continued)

FOREIGN PATENT DOCUMENTS

| | | |
|---|---|---|
| JP | 2003015902 A | 1/2003 |
| JP | 2012510707 | 5/2012 |

(Continued)

OTHER PUBLICATIONS

International Search Report dated Mar. 22, 2013 for International Patent Application No. PCT/US2013/022919. 3 pages.
(Continued)

*Primary Examiner* — Ross N Gushi
(74) *Attorney, Agent, or Firm* — KCO Legal, Inc.

(57) ABSTRACT

A circuit board for a high speed communication jack including a rigid circuit board in the housing having a substrate, a plurality of vias extending through the substrate with each via being configured to accommodate a pin on the housing, a plurality of traces on a middle layer in the substrate, with each trace extending from a corresponding one of the plurality of vias, a first shielding layer on a first side of the middle layer in the substrate, a second shielding layer on a second side of the middle layer in the substrate, and a third shielding layer adjacent to the second shielding layer.

20 Claims, 8 Drawing Sheets

Related U.S. Application Data continuation of application No. 15/146,008, filed on May 4, 2016, now Pat. No. 10,141,698, which is a continuation of application No. 14/504,088, filed on Oct. 1, 2014, now Pat. No. 9,337,592, which is a continuation-in-part of application No. 13/739,214, filed on Jan. 11, 2013, now Pat. No. 8,858,266.

(60) Provisional application No. 61/598,288, filed on Feb. 13, 2012.

(51) Int. Cl.
| | |
|---|---|
| *H01R 13/66* | (2006.01) |
| *H05K 1/02* | (2006.01) |
| *H05K 1/09* | (2006.01) |
| *H05K 1/11* | (2006.01) |
| *H05K 1/16* | (2006.01) |
| H01R 24/64 | (2011.01) |
| *H01R 13/6581* | (2011.01) |
| H01R 107/00 | (2006.01) |

(52) U.S. Cl.
CPC ..... H01R 2107/00 (2013.01); *Y10T 29/49165* (2015.01); *Y10T 29/49218* (2015.01)

(56) References Cited

U.S. PATENT DOCUMENTS

| | | |
|---|---|---|
| 6,769,937 B1 | 8/2004 | Roberts |
| 7,018,242 B2 | 3/2006 | Brown |
| 7,252,554 B2 | 8/2007 | Caveney et al. |
| 7,357,683 B2 | 4/2008 | Caveney et al. |
| 7,364,470 B2 | 4/2008 | Hashim |
| 7,402,085 B2 | 7/2008 | Hammond, Jr. et al. |
| 7,452,246 B2 | 11/2008 | Caveney et al. |
| 7,544,088 B2 | 6/2009 | Caveney et al. |
| 7,601,034 B1 | 10/2009 | Aekins et al. |
| 7,618,296 B2 | 11/2009 | Caveney |
| 7,670,193 B2 | 3/2010 | Milette et al. |
| 7,736,195 B1 | 6/2010 | Poulsen et al. |
| 7,823,281 B2 | 11/2010 | Caveney et al. |
| 7,824,231 B2 | 11/2010 | Marti et al. |
| 7,837,513 B2 | 11/2010 | Milette et al. |
| 7,850,492 B1 | 11/2010 | Straka et al. |
| 7,857,667 B1 | 12/2010 | Wang |
| 7,874,879 B2 | 1/2011 | Caveney et al. |
| 7,905,753 B2 | 3/2011 | Siev et al. |
| 7,909,649 B2 | 3/2011 | Laroche |
| 7,914,345 B2 | 3/2011 | Bopp et al. |
| 7,967,645 B2 | 6/2011 | Marti et al. |
| 8,011,972 B2 | 9/2011 | Caveney et al. |
| 8,047,879 B2 | 11/2011 | Hashim |
| 8,052,483 B1 | 11/2011 | Straka et al. |
| 8,083,551 B2 | 12/2011 | Hetzer et al. |
| 8,262,415 B2 | 9/2012 | Caveney et al. |
| 8,287,317 B2 | 10/2012 | Straka et al. |
| 8,303,348 B2 | 11/2012 | Straka et al. |
| 8,435,083 B2 | 5/2013 | Helzer et al. |
| 8,435,084 B2 | 5/2013 | Caveney et al. |
| 8,550,850 B2 | 10/2013 | Caveney et al. |
| 8,632,362 B2 | 1/2014 | Straka et al. |
| 8,632,367 B2 | 1/2014 | Caveney |
| 8,764,476 B1 | 7/2014 | Ma |
| 2002/0191140 A1 | 12/2002 | Eguchi et al. |
| 2004/0116081 A1 | 6/2004 | Crudele et al. |
| 2005/0181676 A1 | 8/2005 | Caveney et al. |
| 2006/0014410 A1 | 1/2006 | Caveney |
| 2006/0121792 A1 | 6/2006 | Hashim |
| 2006/0160428 A1 | 7/2006 | Hashim |
| 2007/0015417 A1 | 1/2007 | Caveney et al. |
| 2007/0117469 A1 | 5/2007 | Caveney et al. |
| 2007/0178772 A1 | 8/2007 | Hashim et al. |
| 2007/0190863 A1 | 9/2007 | Caveney et al. |
| 2008/0020652 A1 | 1/2008 | Caveney et al. |
| 2008/0166925 A1 | 7/2008 | Caveney et al. |
| 2009/0242241 A1 | 10/2009 | Takahashi et al. |
| 2010/0041278 A1 | 2/2010 | Bopp et al. |
| 2011/0104933 A1 | 5/2011 | Straka et al. |
| 2012/0122352 A1 | 5/2012 | Caveney |
| 2012/0129404 A1 | 5/2012 | Caveney et al. |
| 2012/0164884 A1 | 6/2012 | Helzer et al. |
| 2012/0184154 A1 | 7/2012 | Straka et al. |
| 2012/0282818 A1 | 11/2012 | Caveney |
| 2013/0210277 A1 | 8/2013 | Robinson |
| 2013/0288538 A1 | 10/2013 | Caveney et al. |
| 2014/0073196 A1 | 3/2014 | Hashim et al. |
| 2014/0154919 A1 | 6/2014 | Straka et al. |
| 2014/0206240 A1 | 7/2014 | Schumacher et al. |

FOREIGN PATENT DOCUMENTS

| | | |
|---|---|---|
| JP | 2013510404 | 3/2013 |
| WO | 2008115945 | 9/2008 |

OTHER PUBLICATIONS

International Search Report dated Mar. 13, 2017 for International Patent Application No. PCT/US2016/063866, 7 pages.
International Written Opinion dated Mar. 13, 2017 for International Patent Application No. PCT/US2016/063866, 5 pages.
International Search Report dated Jul. 13, 2017 for International Patent Application No. PCT/US2017/030968, 6 pages.
International Written Opinion dated Jul. 13, 2017 for International Patent Application No. PCT/US2017/030968, 5 pages.

HIGH SPEED COMMUNICATION JACK

CROSS-REFERENCE TO RELATED APPLICATIONS

The present disclosure is a continuation of U.S. patent application Ser. No. 16/192,139, filed Nov. 15, 2018, which is a continuation of U.S. patent application Ser. No. 15/146,008, filed May 4, 2016, now U.S. Pat. No. 10,141,698, which is a continuation of U.S. patent application Ser. No. 14/504,088, filed Oct. 1, 2014, now U.S. Pat. No. 9,337,592, which is a continuation in part of U.S. patent application Ser. No. 13/739,214, filed Jan. 11, 2013, now U.S. Pat. No. 8,858,266, which claims the benefit of and priority to U.S. Provisional Patent Application No. 61/598,288, filed on Feb. 13, 2012, all of which are incorporated by reference herein in their entirety.

FIELD OF THE DISCLOSURE

The present disclosure relates to a network connection jack used to connect a network cable to a device.

BACKGROUND OF THE DISCLOSURE

As electrical communication devices and their associated applications become more sophisticated and powerful, their ability to gather and share information with other devices also becomes more important. The proliferation of these intelligent, inter networked devices has resulted in a need for increasing data throughput capacity on the networks to which they are connected to provide the improved data rates necessary to satisfy this demand. As a result, existing communication protocol standards are constantly improved or new ones created. Nearly all of these standards require or significantly benefit, directly or indirectly, from the communication of high-definition signals over wired networks. Transmission of these high definition signals, which may have more bandwidth and, commensurately, higher frequency requirements, need to be supported in a consistent fashion. However, even as more recent versions of various standards provide for theoretically higher data rates or speeds, they are still speed limited by the current designs of certain physical components. Unfortunately, the design of such physical components is plagued by a lack of understanding of what is necessary to achieve consistent signal quality at multi-gigahertz and higher frequencies.

For example, communication jacks are used in communication devices and equipment for the connection or coupling of cables that are used to transmit and receive the electrical signals that represent the data being communicated. A registered jack (RJ) is a standardized physical interface for connecting telecommunications and data equipment. The RJ standardized physical interface includes both jack construction and wiring pattern. A commonly used RJ standardized physical interface for data equipment is the RJ45 physical network interface, also referred to as an RJ45 jack. The RJ45 jack is widely used for local area networks such as those implementing the Institute of Electrical and Electronic Engineers (IEEE) 802.3 Ethernet protocol. The RJ45 jack is described in various standards, including one that is promulgated by the American National Standards Institute (ANSI)/Telecommunications Industry Association (TIA) in ANSI/TIA-1096-A.

All electrical interface components, such as cables and jacks, including the RJ45 jack, not only resist the initial flow of electrical current, but also oppose any change to it. This property is referred to as reactance. Two relevant types of reactance are inductive reactance and capacitive reactance. Inductive reactance may be created, for example, based on a movement of current through a cable that resists, which causes a magnetic field that induces a voltage in the cable. Capacitive reactance, on the other hand, is created by an electrostatic charge that appears when electrons from two opposing surfaces are placed close together.

To reduce or avoid any degradation of transmitted signals, the various components of a communications circuit preferably have matching impedances. If not, a load with one impedance value will reflect or echo part of a signal being carried by a cable with a different impedance level, causing signal failures. For this reason, data communication equipment designers and manufacturers, such as cable vendors, design and test their cables to verify that impedance values, as well as resistance and capacitance levels, of the cables comply with certain performance parameters. The RJ45 jack is also a significant component in nearly every communications circuit, however, jack manufacturers have not provided the same level of attention to its performance. Thus, although problems related to existing RJ45 jacks are well documented in tests and their negative impact on high frequency signal lines is understood, the industry seems reluctant to address the issues for this important component of the physical layer. Consequently, there is a need for an improved high speed communications jack.

BRIEF SUMMARY OF THE DISCLOSURE

In one example, a high speed communication jack may include a housing including a port for accepting a plug. The port may include a plurality of pins each connected to a corresponding signal line in the plug, a shielding case surrounding the housing, and a flexible circuit board between the shielding case and the housing. The flexible circuit board may include a substrate, a plurality of vias extending through the substrate with each via being configured to accommodate a pin on the housing, a plurality of traces on a first side of the substrate, with each trace extending from a corresponding one of the plurality of vias, and a shielding plane on a second side of the substrate opposite the first side of the substrate.

In another example, when energized, each trace may be differentially matched to a second adjacent trace.

In another example, the impedance value a first trace in a matched pair of traces may be adjusted to be substantially equal to the impedance value of the second trace in the matched pair of traces.

In another example, a capacitor may be formed in each via by a trace layer and a return signal layer embedded in a dielectric layer.

In another example, a distance between the return signal layer and the trace layer may be adjusted such that the capacitor has a value of between approximately 0.1 pF and approximately 0.5 pF.

In another example, the width, height or length of each trace in matched set of traces may be adjusted such that the impedance of the first trace matches the impedance of the second trace.

In another example, a second return signal layer may be formed in the dielectric layer below the first return signal layer to form a second capacitor.

In another example, the distance between the first signal layer and second signal layer may be adjusted to adjust the value of the second capacitor between 0.1 pF and 0.5 pf.

In another example, the impedance of the first trace and second trace may be adjusted such that the traces are matched when a first signal is transmitted on the first trace and a second signal is transmitted on the second trace.

In another example, the capacitor, trace and return signal layer may form a common mode filter with the matched set of traces.

In another example, the value of the capacitor may be adjusted such that the common mode filter prevent reflections of signals from the matched traces.

In another example, a second shielding tab on a side of the substrate may be formed opposite the first shielding.

In another example, the traces may be plated in gold.

Another example may include a high speed communication jack comprising a standard RJ45 housing a housing including a port for accepting a plug, the port including a plurality of pins each connected to a corresponding signal line in the plug. The jack may include a shielding case surrounding the housing, and a flexible circuit board between the shielding case and the housing. The flexible circuit board may include a substrate, a plurality of vias extending through the substrate with each via being configured to accommodate a pin on the housing, a plurality of traces on a first side of the substrate, with each trace extending from a corresponding one of the plurality of vias, and a shielding plane on a second side of the substrate opposite the first side of the substrate.

Another example may include a method of manufacturing a high speed communication jack using a standard RJ45 housing having a front surface, back surface, top surface, bottom surface, right surface and left surface, the housing including a plurality of pins each connected to a corresponding signal line in the plug. The method may include the steps of forming a flexible circuit board having a substrate, a plurality of vias extending through the substrate with each via being configured to accommodate a pin on the housing, a plurality of traces on a first side of the substrate, with each trace extending from a corresponding one of the plurality of vias, a shielding plane on a second side of the substrate opposite the first side of the substrate, and at least two shielding tabs on opposite ends of the flexible circuit board and connected to the electrical circuit board by a shielding trace. Inserting each via in the flexible circuit board into a corresponding pin in the housing. Bending the flexible circuit board such that a portion of the flexible circuit board having the vias is on the bottom surface of the housing and is orthogonal to the portion of the flexible circuit board having the shielding plane that is on the back portion of the housing. Bending each shielding tab such that one shielding tab is in contact with the left side surface and one shielding tab is in contact with the right side surface of the housing, and forming a shielding case over the flexible circuit board and the housing such that the shielding case is in contact with each of the shielding tabs.

Another example may include a high speed communication jack having a housing including a port for accepting a plug, the port including a plurality of pins each connected to a corresponding signal line in the plug, a shielding case surrounding the housing, and a multilayer flexible circuit board between the shielding case and the housing. The multilayer flexible circuit board may include a first layer having a plurality of traces, with each trace extending from a corresponding one of the plurality of vias, a second layer of a dielectric material on a side of the first layer opposite the traces, a third layer on a side of the second layer opposite the first layer and having a return plane made from a conductive material, a fourth layer on a side of the third layer opposite the second layer and made of a dielectric material, and a fifth layer on a side of the fourth layer opposite the third layer and made of a conductive material. A plurality of vias may extend through the first, second, third, fourth and fifth layers, with each via being configured to accommodate a pin on the housing.

DETAILED DESCRIPTION OF THE DISCLOSURE

Figure 1:
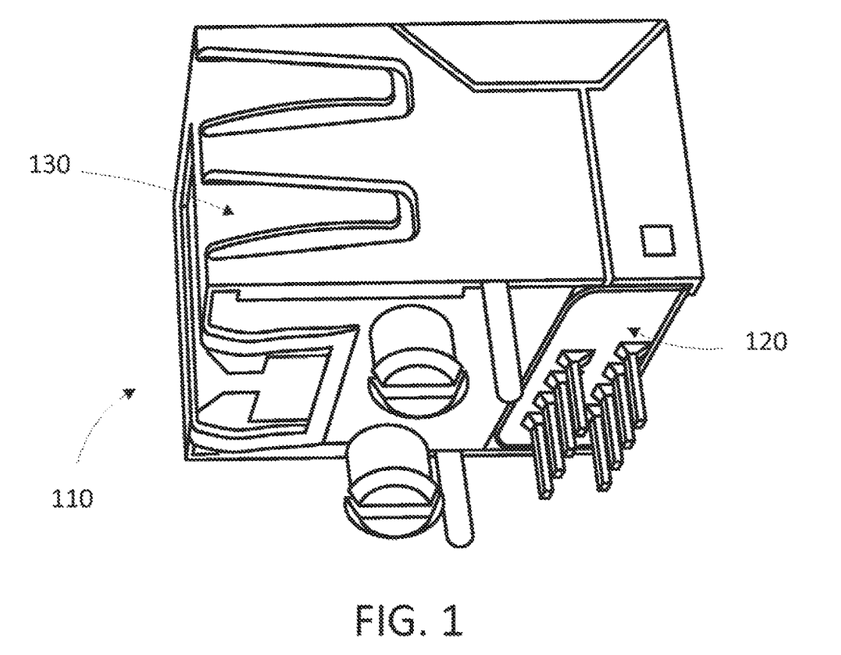
FIG. 1 illustrates a high speed communications jack configured in accordance with one embodiment of the various aspects of the present disclosure that includes an RJ45 jack.

FIG. 1 illustrates a high speed communications jack configured in accordance with one embodiment of the various aspects of the present disclosure that includes an RJ45 jack 110, a flexible printed circuit board (PCB) 120, and a jack shield 130. As described herein, in accordance with various aspects of this disclosure, the flexible PCB 120 provides a balanced, radio frequency tuned circuit that may be directly soldered onto each pin of the RJ45 jack 110, while the jack shield 130 provides shielding for the RJ45 jack 110 and the flexible PCB 120, as well as functioning as a chassis ground. In combination, the RJ45 jack 110, the flexible PCB 120, and the jack shield 130 may provide functionality similar to a tuned waveguide and a tube through which communication signals may be transmitted, where an energy portion of the communication signal travels outside the tube through jack shield 130; and an information portion of the communication signal travels within the tube along the non-resistive gold wire; thereby allowing for high speed data signal speeds to be obtained. For example, it is envisioned that data speeds of 40 gigabits (Gbs) and beyond may be supported.

Although an RJ 45 communication jack is used below, the present communication jack is not limited to RJ 45 communication jacks and may be used in any type of high speed communication jack including, all class of modular RJ type connectors, Universal Serial Bus (USB) connectors and jacks, Firewire (1394) connectors and jacks, HDMI (High-Definition Multimedia Interface) connectors and jacks, D-subminiature type connectors and jacks, ribbon type connectors or jacks, or any other connector or jack receiving a high speed communication signal.

In various aspects of this disclosure, the various pins and traces disclosed herein may be composed of any suitable conductive elements such as gold, silver, or copper, or alloys and combinations of any suitable conductive elements. For example, the set of pins and plug contacts of the RJ45 jack 110 may include gold-plated copper pins or wires, while the set of traces of the flexible PCB 120 may include gold-plated copper paths. The gold plating is used to provide a corrosion-resistant electrically conductive layer on copper, which is normally a material that oxidizes easily. Alternatively, a layer of a suitable barrier metal, such as nickel, may be deposited on the copper substrate before the gold plating is applied. The layer of nickel may improve the wear resistance of the gold plating by providing mechanical backing for the gold layer. The layer of nickel may also reduce the impact of pores that may be present in the gold layer. At higher frequencies, gold plating may not only reduce signal loss, but may also increase the bandwidth from the skin effect where current density is highest on the outside edges of a conductor. In contrast, use of nickel alone will result in signal degradation at higher frequencies due to the same effect. Thus, higher speeds may not be achieved in RJ45 jacks that use nickel plating alone. For example, a pin or trace plated only in nickel may have its useful signal length shortened as much as three times once signals enter the GHz range although some benefits of using gold plating over the copper path has been described herein, other conductive elements may be used to plate the copper paths. For example, platinum, which is also non-reactive but a good conductor, may be used instead of gold to plate the copper paths.

Each of the major components of the high speed communications jack, namely the RJ45 jack 110, the flexible printed circuit board (PCB) 120, and the jack shield 130 will be described briefly herein before a discussion of how these components interoperate to achieve support for high speed communications is provided.

Figure 2:
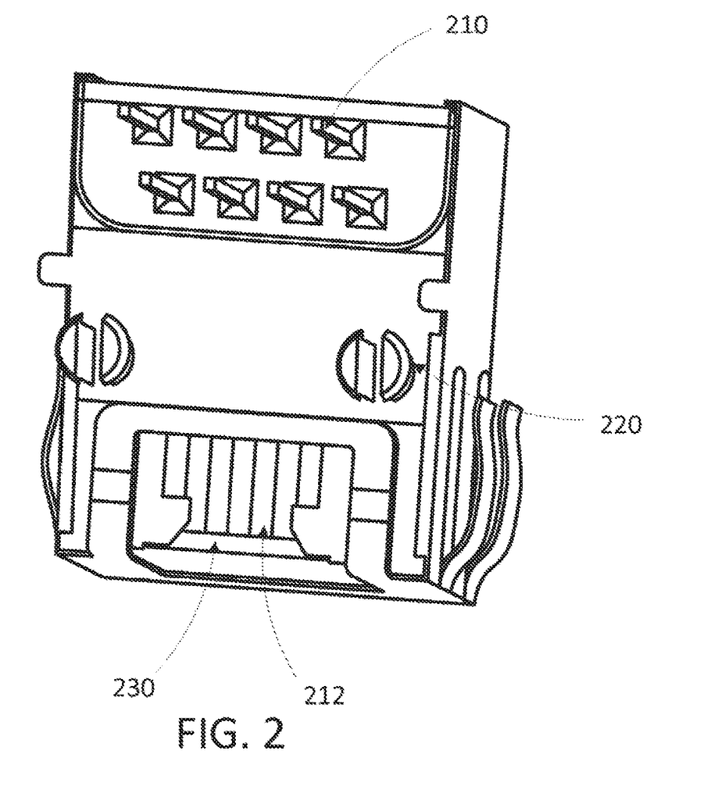
FIG. 2 illustrates a bottom perspective portion of a left side portion of the RJ45 jack of FIG. 1.

FIG. 2 illustrates a bottom perspective view of a front portion of the RJ45 jack 110 of FIG. 1, where it may be seen that a plug opening 230 is provided for inserting a plug (not shown). The plug opening 230 may be configured to receive the plug to couple contacts on the plug to a set of plug contacts 212 in the RJ45 jack 110. The plug may be an RJ45 8 Position 8 Contact (8P8C) modular plug. The set of plug contacts 212 are formed into a set of pins 210 configured to be attached to a communication circuit on a circuit board. For example, the RJ45 jack 110 may be mounted to a circuit board of a network switch device through the use of a pair of posts 220, and then the set of pins 210 may be soldered onto respective contact pads on the circuit board of the device. By itself, a jack similar to the RJ45 jack 110 as illustrated in FIG. 2 provides basic connectivity between a plug of an RJ45 cable and the circuit board of a device into which the jack is integrated. However, that jack is not designed to handle communication frequencies needed for high speed communications. The RJ45 jack 110, as configured in accordance with various aspects of the disclosed approach as described herein, may be integrated with other components such as the jack shielding 130 and the flexible PCB 120 so that it may be used to communicate at higher speeds without interference from transient signals.

Figure 3:
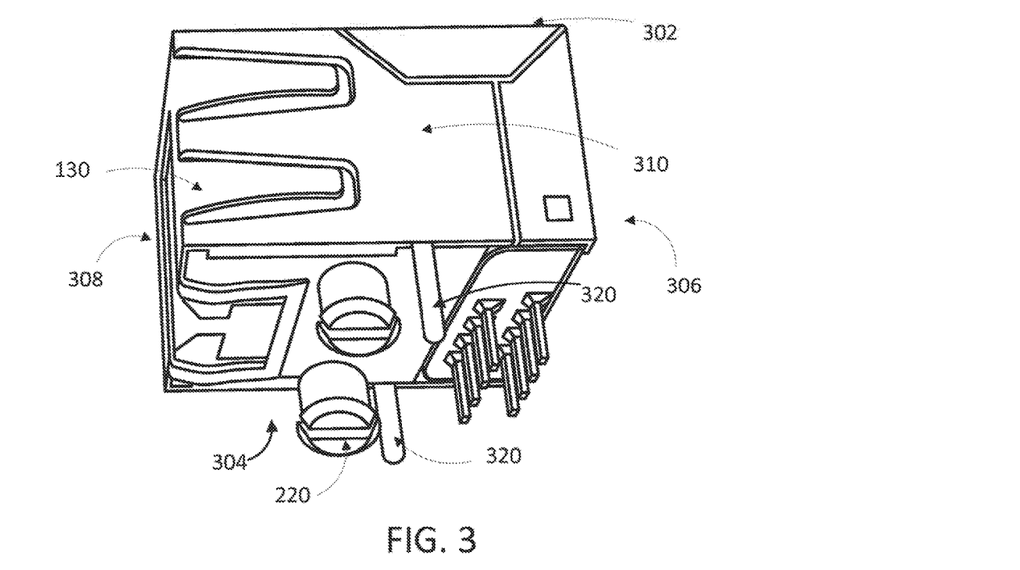
FIG. 3 illustrates a bottom and right side view of a jack shield for providing shielding for the RJ45 jack and the flexible printed circuit board of FIG. 1.

FIG. 3 illustrates a bottom and right side view of a jack shield for providing shielding for the RJ45 jack 110 and the flexible PCB 120. The jack shield 130 includes a top portion 302, a bottom portion 304, a back portion 306, a front portion 308, a left side portion (not shown but substantially identical to the right side portion) and a right side portion 310. In order to provide desired shielding properties, in one embodiment of the present disclosure the jack shield 130 may include a conductive material such as, but not limited to, steel, copper, or any other conductive material. A pair of tabs 320 on both the right side 310 and the left side (not shown) of the jack shield 130, near the bottom portion 304, may be used to ground and secure the jack shield 130 to a circuit board within a device (not shown). For example, the pair of tabs 320 on the jack shield 130 may be inserted into a pair of matched mounting holes on the circuit board, and soldered thereon.

Figure 4A:
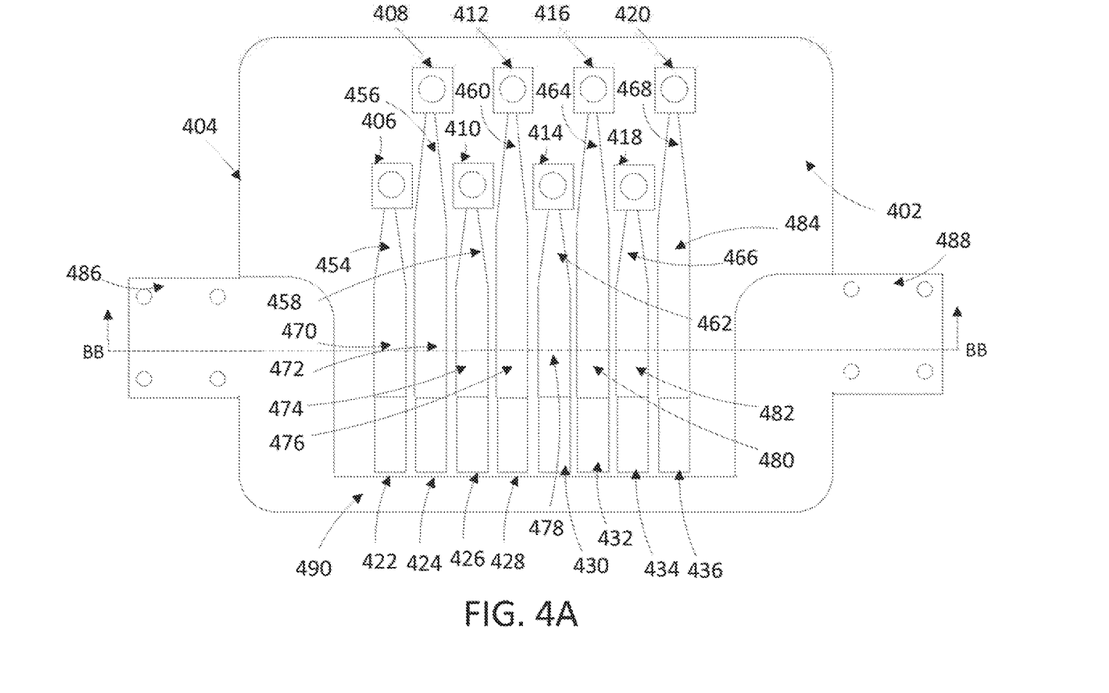
FIG. 4A illustrates a schematic representation of a top view of the front surface of the printed circuit board of FIG. 1.
Figure 4B:
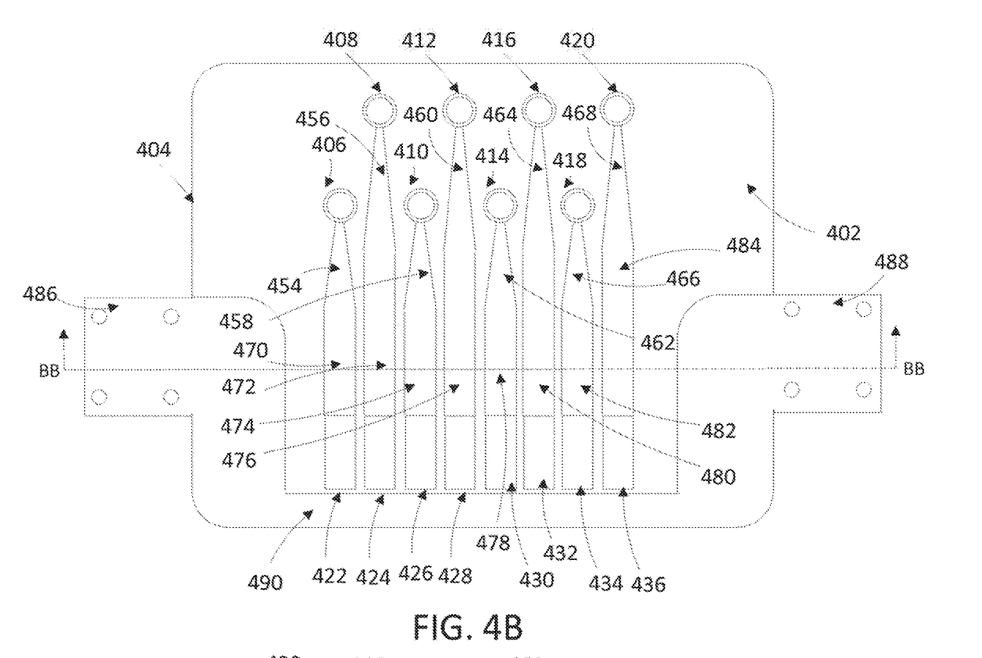
FIG. 4B illustrates another embodiment of a schematic representation of a top view of the front surface of the printed circuit board of FIG. 1

FIG. 4A illustrates a schematic representation of a top view of the front surface of the PCB 120 of the RJ45 jack. The PCB 120 includes a multi-layer substrate 402 made of a dielectric material incorporating strip-line flex or equivalent technology. The edge of the substrate 402 is surrounded by a protective layer 404. The protective layer 404 is made of a non-conducting material such as, but not limited to, plastic or a flexible solder mask. The front surface of the substrate 402 includes a plurality of vias 406, 408, 410, 412, 414, 416, 418 and 420 made through the substrate 402. Each via 406, 408, 410, 412, 414, 416, 418 and 420 passes through the substrate 402 and is sized to accommodate a pin 210. The area surrounding each via 406, 408, 410, 412, 414, 416, 418 and 420 is coated with a conductive material, such as gold. The coating surrounding each via 406, 408, 410, 412, 414, 416, 418 and 420 may be substantially square shaped or substantially rectangular shaped. In another embodiment, depicted in FIG. 4B, the coating surrounding each via 406, 408, 410, 412, 414, 416, 418 and 420 may be substantially circular shaped. By making the coating circular shaped, the interference between adjacent vias 406, 408, 410, 412, 414, 416, 418 and 420 is reduced.

A plurality of traces 422, 424, 426, 428, 430, 432, 434 and 436 extend from each via 406, 408, 410, 412, 414, 416, 418 and 420 towards an end of the PCB 120. Each trace 422, 424, 426, 428, 430, 432, 434 and 436 is made from a conductive material including copper or gold. In one embodiment, a nickel layer is formed on the substrate 402 and a gold layer is formed on the nickel layer to form each trace 422, 424, 426, 428, 430, 432, 434 and 436. Each trace 422, 424, 426, 428, 430, 432, 434 and 436 extends towards a back end of the PCB 120 until the trace 422, 424, 426, 428, 430, 432, 434 or 436 reaches a shielding trace layer 490 near an edge of the PCB 120 opposite the vias 406, 408, 410, 412, 414, 416, 418 and 420. Each trace 422, 424, 426, 428, 430, 432, 434 and 436 includes a first portion 454, 456, 458, 460, 462, 464, 466 and 468 adjacent to a second portion 470, 472, 474, 476, 478, 480, 482 and 484 with each second portion 470, 472, 474, 476, 478, 480, 482 and 484 extending to the shielding trace layer 490 without contacting the shielding trace layer 490. Each first portion 454, 456, 458, 460, 462, 464, 466 and 468 tapers from the respective second portion 470, 472, 474, 476, 478, 480, 482 and 484 towards a respective via 406, 408, 410, 412, 414, 416, 418 or 420. Each second portion 470, 472, 474, 476, 478, 480, 482 and 484 has a length that varies depending on the trace 422, 424, 426, 428, 430, 432, 434 or 436.

Two shielding tabs 486 and 488 are positioned on opposite edges of the PCB 120. Each shielding tab 486 and 488 is made of a substrate covered in a conductive material for example, gold or copper. The shielding tabs 486 and 488 are electrically connected by the shield trace layer 490 on the substrate 402 that extends between the shielding tabs 486 and 488 and is positioned between the second portions 470, 472, 474, 476, 478, 480, 482 and 484 of each trace 422, 424, 426, 428, 430, 432, 434 and 436 and the edge of the PCB 120 opposite the vias 406, 408, 410, 412, 414, 416, 418 and 420.

Figure 5A:
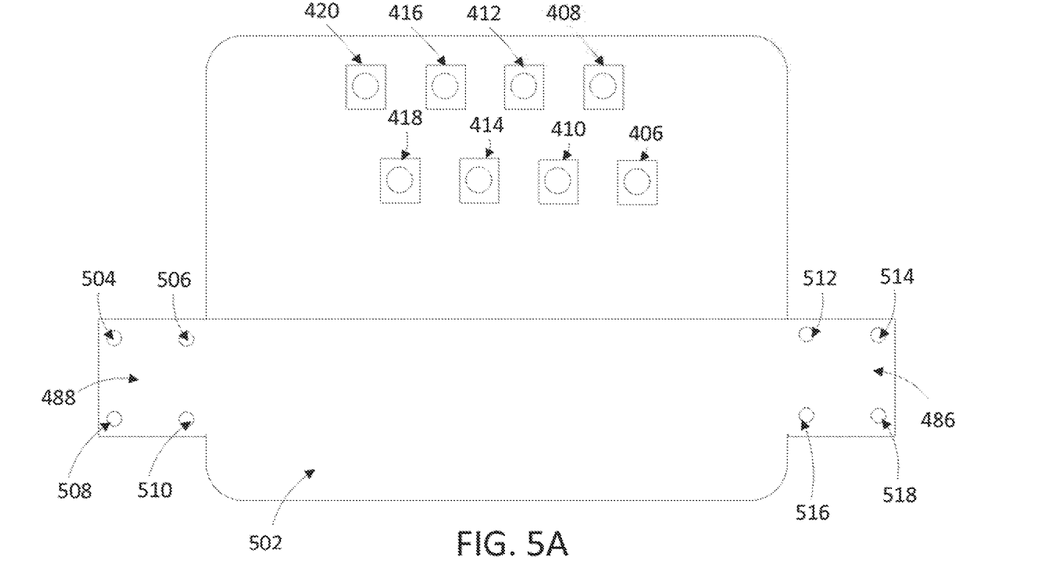
FIG. 5A illustrates a schematic representation of a top view of the back surface of the printed circuit board of FIG. 4.
Figure 5B:
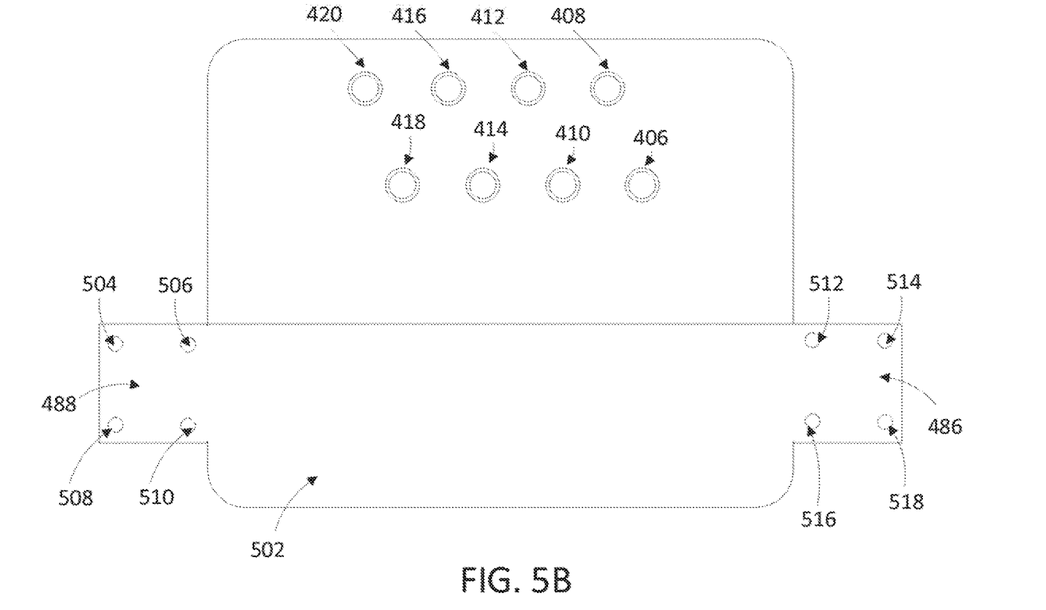
FIG. 5B illustrates another embodiment of a schematic representation of a top view of the back surface of the printed circuit board of FIG. 4

FIG. 5A illustrates a schematic representation of a top view of the back surface of the printed circuit board of FIG. 4A. The back surface includes the vias 406, 408, 410, 412, 414, 416, 418 and 420, the shielding tabs 486 and 488, and a shielding trace layer 502 extending between the back surfaces of each shielding tab 486 and 488. The shielding trace layer 502 covers the portion of the back surface of the PCB 120 between the shielding tabs 486 and 488. The shielding tabs 486 and 488 include return vias 504, 506, 508, 510, 512, 514, 516 and 518 which pass through the substrate 402 connecting the shielding trace layer 490 and the shielding trace layer 502. FIG. 5B depicts another embodiment of a top view of the back surface of the printed circuit board of FIG. 4B.

Figure 6A:
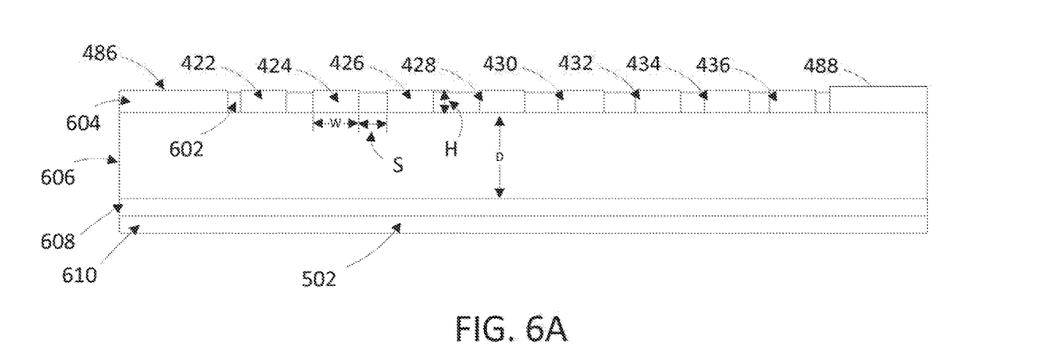
FIG. 6A illustrates a cross sectional view of the substrate of the printed circuit board of FIG. 4 along line BB.

FIG. 6A illustrates a cross-section view of the multi-layer substrate 402 in the PCB 120 along line BB of FIG. 4. A first layer 602 of the multi-layer substrate 402 includes a solder mask portion, made from a material such as PSR9000FST Flexible Solder Mask. A second layer 604 is formed under the top layer and includes each of the traces 422, 424, 426, 428, 430, 432, 434 and 436. Each trace 422, 424, 426, 428, 430, 432, 434 and 436 has a length (L), a height (H) and a width (W), and is separated from an adjacent trace by a distance (S). The length (L) of each trace is the length the trace extends along the surface of the flexible circuit board 120 from the edge of its respective via 406, 408, 410, 412, 414, 416, 418 and 420 to shielding trace layer 490.

Each trace 422, 424, 426, 428, 430, 432, 434 and 436 extends through the first layer 602 such that each trace 422, 424, 426, 428, 430, 432, 434 and 436 is not covered by the flexible solder mask. Shield trace layer 490 is also formed over a portion of the second layer 604 with the shield trace layer 490 extending through the first layer 602. A third dielectric layer 606 is formed below the second layer 604 The third layer 606 has a depth (D) of between approximately 0.002 mils to approximately 0.005 mils, and is made from a material having a dielectric constant greater than 3.0 such as, but not limited to RO XT8100, Rogerson Material, or any other material capable of isolating a high frequency electrical signal.

A fourth layer 608 is formed below the third layer 606 with the fourth layer 608 including a signal return portion and a shield trace portion 502. Both the signal return portion and the shield trace portion 502 are made of a conductive material, preferably gold or copper. A fifth layer 610 is formed on the forth layer 608 with the fifth layer 610 having a flexible solder mask portion and a shielding trace layer 502 portion. The flexible solder mask portion is manufactured of the same material as the flexible solder mask portion of the first layer 602. In an alternate example, the flexible solder mask portion is made from a different material than the flexible solder mask in the first layer 602. In an alternate example, a second signal return layer (not shown) may be positioned in the dielectric material.

To eliminate crosstalk caused by adjacent traces, each trace 422, 424, 426, 428, 430, 432, 434 and 436 is electrically coupled to an adjacent trace 422, 424, 426, 428, 430, 432, 434 and 436. As an illustrative example, trace 422 may be coupled to trace 424. During operation, a first signal is transmitted down a first trace and an identical signal having an opposite polarity is transmitted down the matched trace thereby differentially coupling the traces together. Because the traces are differentially coupled together, the impedance of each trace determines how the trace is driven. Accordingly, the impedance of each set of matched trace should be substantially equal.

The physical characteristics of each trace 422, 424, 426, 428, 430, 432, 434 and 436 in a matched set of traces are adjusted to balance the impedance between the matched traces for the transmission and return signals transmitted over each trace. The impedance of each trace 422, 424, 426, 428, 430, 432, 434 and 436 is adjusted by adjusting any one or a combination of the length (L), width (W), height (H) of each trace and the spacing (S) between the matched traces for each signal transmitted through each trace 422, 424, 426, 428, 430, 432, 434 and 436. The height (H) of each trace 422, 424, 426, 428, 430, 432, 434 and 436 may be between approximately 2 mils and approximately 6 mils, and the spacing (S) between adjacent traces 422, 424, 426, 428, 430, 432, 434 and 436 may be between approximately 3 mils and approximately 10 mils.

Returning to FIG. 4, each trace has a variable width in the first portion 454, 456, 458, 460, 462, 464, 466 and 468 and a substantially constant width in the second portion 470, 472, 474, 476, 478, 480 and 482. Accordingly, the width of each trace 422, 424, 426, 428, 430, 432, 434 and 436 is adjusted in either the first portion 454, 456, 458, 460, 462, 464, 466 and 468 or the second portion 470, 472, 474, 476, 478, 480 and 482, or in both the first portion 454, 456, 458, 460, 462, 464, 466 and 468 and the second portion to 470, 472, 474, 476, 478, 480 and 482 along with the height H of the trace 422, 424, 426, 428, 430, 432, 434 and 436, such that each trace in a matched set has substantially the same impedance when the matched traces are separated by a distance S.

Due to inconsistencies in manufacturing and materials, the signal driven through each set of differentially matched traces 422, 424, 426, 428, 430, 432, 434 and 436 may not be identical, which causes a portion of the signal to reflect back causing common mode interference. To eliminate any common mode interference, each trace 422, 424, 426, 428, 430, 432, 434 or 436 in a matched set of traces includes a common mode filter that is tuned to eliminate any common mode interference in the matched set. Each filter is comprised of a capacitor formed by the via 406, 408, 410, 412, 414, 416, 418 or 420 of each trace 422, 424, 426, 428, 430, 432, 434 or 436 and the fourth layer 608 of the multi-layer substrate 402. Each via 406, 408, 410, 412, 414, 416, 418 and 420 includes a layer of conductive material, such as gold or copper, formed around the periphery the via 406, 408, 410, 412, 414, 416, 418 and 420 on the second layer 604 and fourth layer 608 of the substrate 402. The conductive material on the first layer 602 is connected to the trace 422, 424, 426, 428, 430, 432, 434 or 436 associated with the via 406, 408, 410, 412, 414, 416, 418 and 420 and the conductive material on the fourth layer 608 is connected to the signal return portion of the fourth layer 608. The size of each capacitor is determined by the distance between the conductive material on the second layer 604 and the fourth layer 608. Accordingly, adjusting the depth of the third layer 606 in relation to the conductive material on the vias 406, 408, 410, 412, 414, 416, 418 and 420, allows for the capacitive effect of each via 406, 408, 410, 412, 414, 416, 418 and 420 to be adjusted. The capacitors created by the via 406, 408, 410, 412, 414, 416, 418 and 420 and return portion of the fourth layer 608 are sized between approximately 0.1 picofarads (pf) to approximately 0.5 pf. The top and bottom surfaces of the substrate 402 may be covered in a plastic insulating layer to further enhance the operation of the circuit.

The combination of the capacitor created in each via 406, 408, 410, 412, 414, 416, 418 and 420 and the characteristic inductance of the signal return layer creates a common mode filter for each trace 422, 424, 426, 428, 430, 432, 434 or 436. By adjusting the capacitive value of each capacitor based on the impedance of the trace 422, 424, 426, 428, 430, 432, 434 and 436, common mode noise is greater reduced, thereby improving the signal throughput on each trace 422, 424, 426, 428, 430, 432, 434 and 436.

Figure 6B:
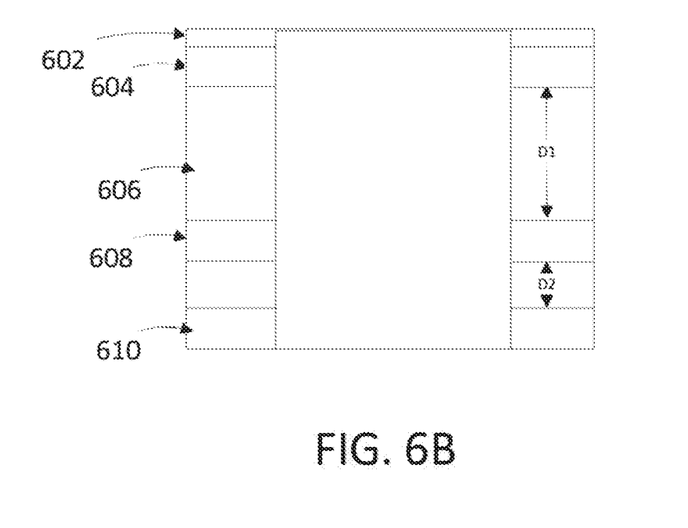
FIG. 6B illustrates a cross sectional view of a via in the printed circuit board of FIG. 4.

FIG. 6B illustrates a schematic representation of a cross sectional view of a via 406, 408, 410, 412, 414, 416, 418 or 420. Each via 406, 408, 410, 412, 414, 416, 418 and 420 is formed through the first layer 602, second layer, 604, third layer 606, fourth layer 608 and fifth layer 610. The second layer 604 is made of a conductive material, such as gold or copper and surrounds the circumference of each via 406, 408, 410, 412, 414, 416, 418 and 420. The second layer 604 also connects each via 406, 408, 410, 412, 414, 416, 418 and 420 to its respective trace 422, 424, 426, 428, 430, 432, 434 or 436. The third layer 606 acts as a dielectric layer as described in FIG. 6A. The fourth layer 608 is formed in the third layer 606 and acts as a signal return layer. The fifth layer 610 is also made from a conductive material such as copper or gold, and also surrounds the circumference of the via in the same manner as the second layer 602. A sealing layer (not shown) may also be formed over the fifth layer 610.

The fourth layer 608 is separated from the second layer 604 by a distance D1 and from the fifth layer 610 by a second distance D2. The combination of the second layer 604, third dielectric layer 606, and the fourth return signal layer 608 creates a capacitor having a capacitive value of between approximately 0.1 pf and 0.5 pf. By adjusting the distance D1 of the fourth layer 608 from the second layer 604, the capacitive value of the via capacitor is adjusted. Because the via connects its associated trace with the fourth return signal layer 608, the combination of second layer 604, the third dielectric layer 606, and the fourth return signal layer 608 forms a common mode filter that removes any interference caused by signal reflection resulting from imperfections in the manufacturing process. By adjusting the capacitive value of the via capacitor the common mode filter may be tuned to eliminate substantially all signal noise caused by reflection of the transmission or return signal.

Figure 6C:
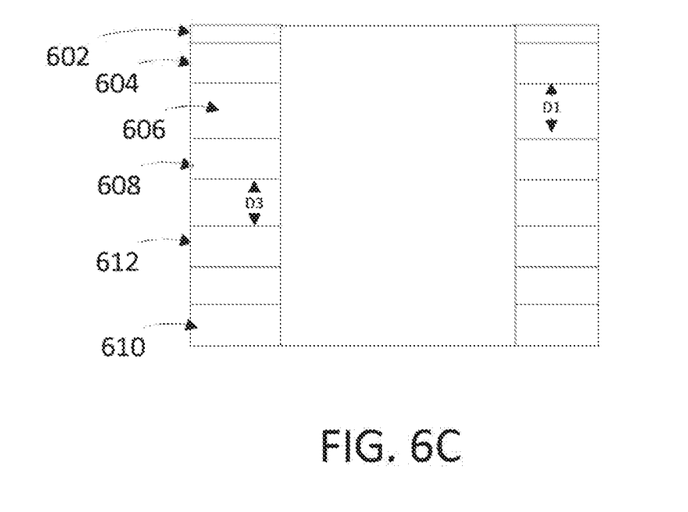
FIG. 6C illustrates a cross sectional view of another example of a via in the printed circuit board of FIG. 4.

FIG. 6C illustrates another example of cross sectional view of a via 406, 408, 410, 412, 414, 416, 418 and 420. A second return signal layer 612 is added to the third layer 606 between the first return signal layer 608 and the fifth layer 610. The second return signal layer 612 runs parallel to the first signal layer 608 and enhances the filtering effect of the common mode filter. By adjusting a distance D3 between the first return signal layer 608 and the second return signal layer 612, a second capacitor formed by the first return signal layer 608, third layer 606 and second return signal layer 612 is created in the via. By adjusting the distance D3, the value of the second via capacitor may be adjusted to enhance the operation of the common mode filter. Further, as the inventors have learned, forming a second capacitor in the via allows for matching of traces on separate ends of the PCB 102. As an illustrative example, trace 422 may be matched with trace 436. Accordingly, by forming the second capacitor, pairs of signal lines positioned in accordance with the RJ 45 standard can be achieved.

Figure 7:
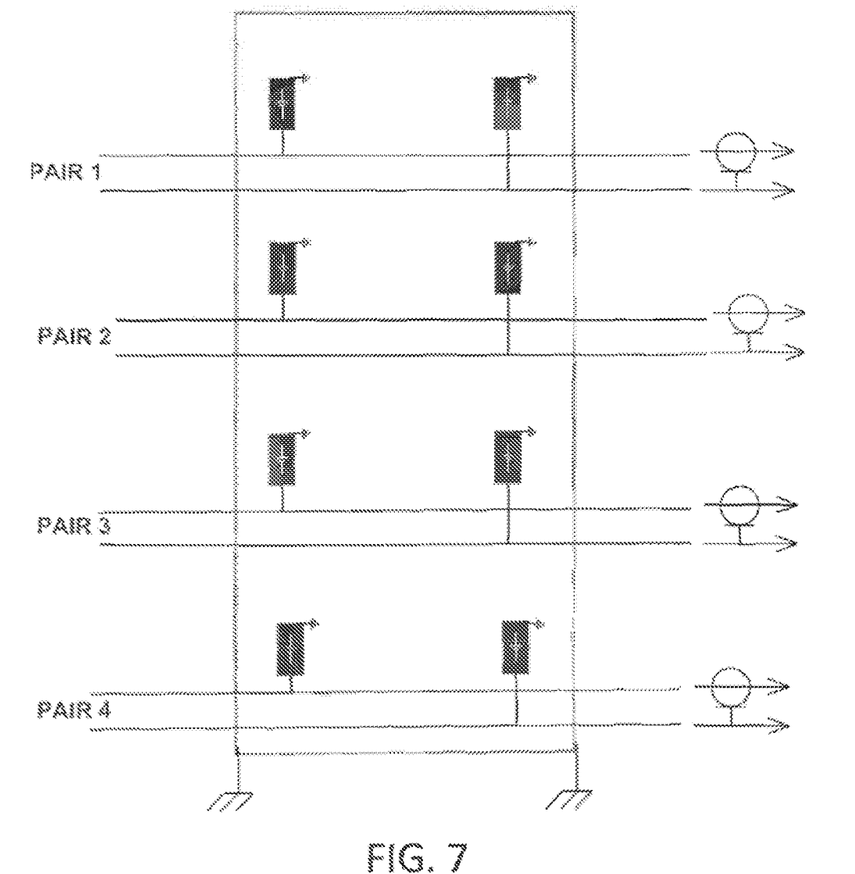
FIG. 7 illustrates a schematic representation an RJ45 jack having transmit and receiving cable pairs matched and balanced to one another.

FIG. 7 illustrates a schematic representation an RJ 45 jack having matched transmit and receive traces. By adjusting the height H, width W, and length L of each trace 422, 424, 426, 428, 430, 432, 434 or 436 transmit and a receive lines can be impedance matched. To enhance the operation of the jack, identical high frequency signals having opposite polarities are transmitted down each pair. Because the matched traces are coupled via the shield, the pairs act as common mode filters for each other. Also, if one signal cannot be delivered, the corresponding opposite signal line will deliver the identical signal. Because the matched traces act as filters coupled to the shield, noise caused by high bandwidth transmission are filtered out from the signal. Further, because the transmit line is matched with the receive line, filtering of the signal is performed with greater accuracy because the reference point for the filters is the signal itself, opposed to being a ground connection.

Figure 8:
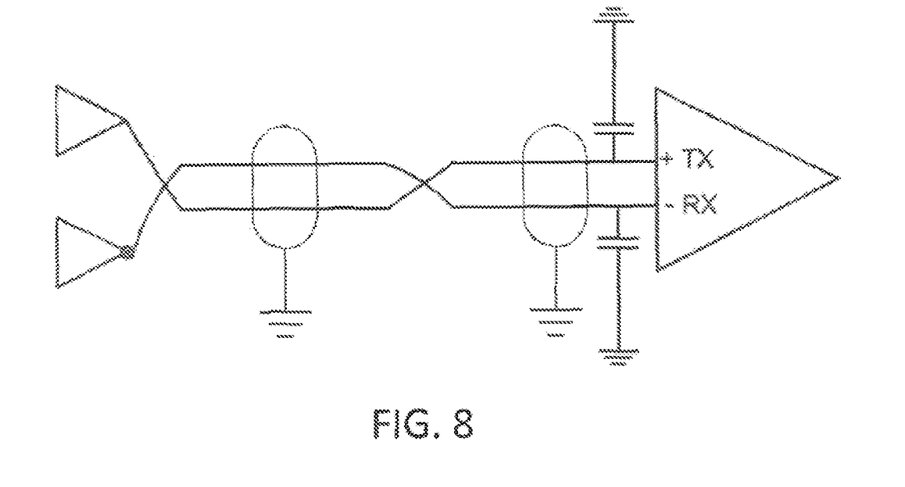
FIG. 8 illustrates a schematic representation of a differentially balanced pair of signal lines.

FIG. 8 illustrates a schematic representation of a differentially balanced pair of signal lines. As the figure depicts, the characteristics of each trace is adjusted such that the impedance of a first trace is matched to the impedance of the second trace using the methods previously discussed. Further, the capacitors formed in each via form a common mode filter with a return signal line embedded in the PCB 120. By differentially balancing two traces during transmission of both the transmission and response signals, a fully balanced two way communication circuit is achieved.

Figure 9:
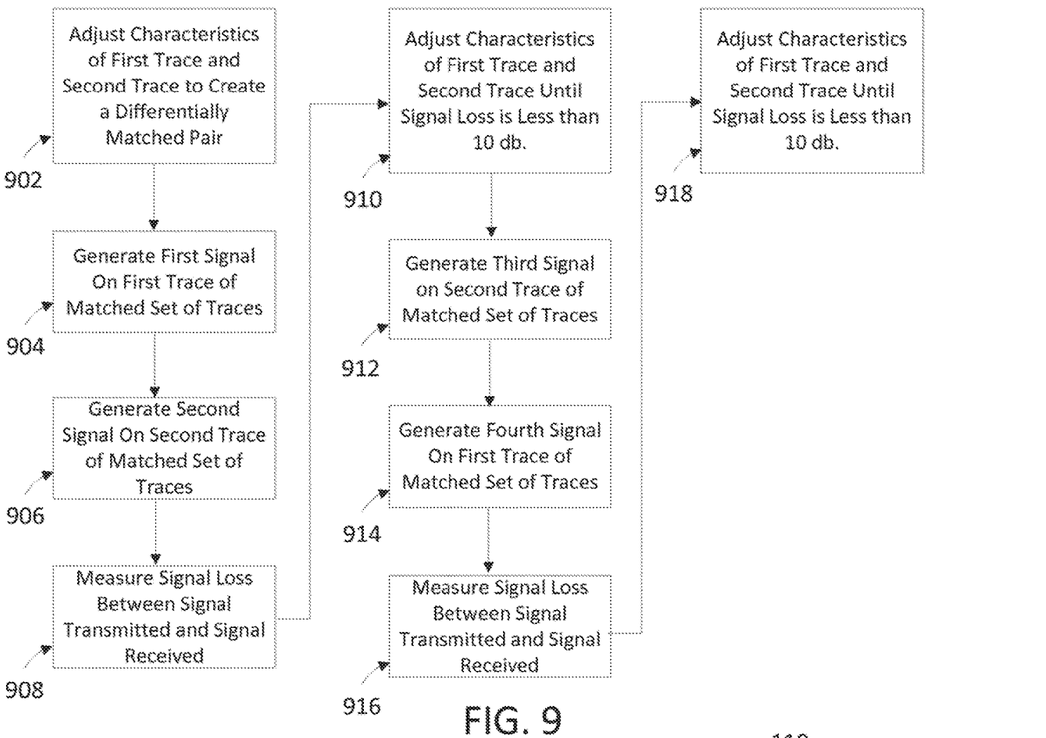
FIG. 9 illustrates a schematic representation of the process used to differentially balance two traces in FIG. 4 based on a first signal and a second signal.

FIG. 9 illustrates a schematic representation of a method of balancing matched traces for a transmission and return signal. In step 902, physical characteristics of each trace in a matched pair of traces are adjusted such that the impedance of the traces are substantially equal. The physical characteristics may include the height, length and width of each trace and the distance separating each trace in the matched set of traces. In step 904, a first signal having a first polarity is transmitted down the first trace in the match set traces. The first signal may be a high frequency communication signal operating at a frequency greater then 10 gigahertz ("GHz"). In step 906, a second signal substantially identical to the first signal and having a polarity opposite to the polarity of the first signal is transmitted on the second trace of the match set of traces simultaneously with the first signal. In step 908, the first signal is measured at the generation and termination end of the trace, and the two measurements are compared to determine the amount of data lost along the length of the trace. In step 910, at least one physical characteristic of the first trace or second trace is adjusted based on the amount of signal loss measured. The process may return to step 904 until the amount of signal loss is less than approximately 10 decibels ("db").

In step 912, a third signal is transmitted on the second trace of the matched set of traces. In step 914, a fourth signal substantially identical to the third signal but having a polarity opposite the polarity of the third signal is transmitted on the first trace. In step 916, the third signal is measured at the generation and termination end of the trace, and the two measurements are compared to determine the amount of data lost along the length of the trace. In step 918, at least one physical characteristic of the first trace or second trace is adjusted based on the amount of signal loss measured. The process may return to step 912 until the amount of signal loss is less than approximately 10 decibels ("db"). In another example, the process may return to step 904 to confirm the signal loss of the first signal is not affected by the adjustments made in response to the third signal loss.

Figure 10A:
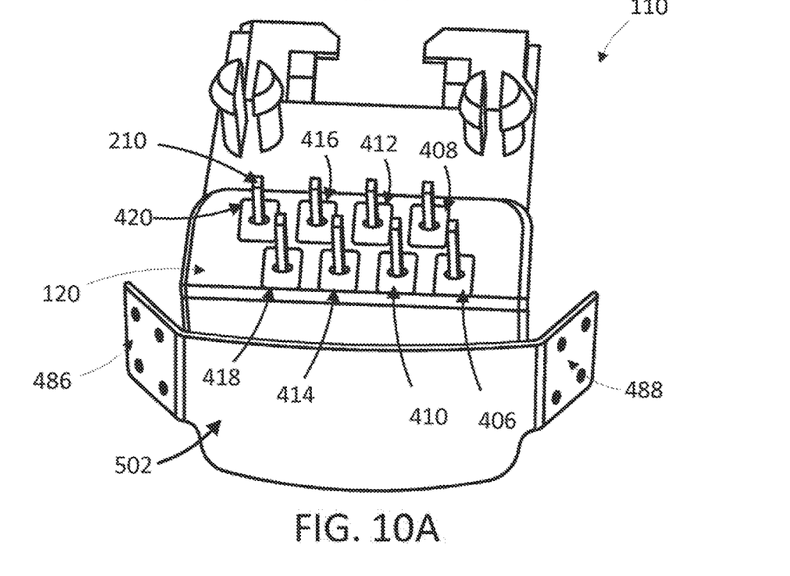
FIG. 10A illustrates a rear perspective view of the RJ45 jack of FIG. 1 with the shield removed.
Figure 10B:
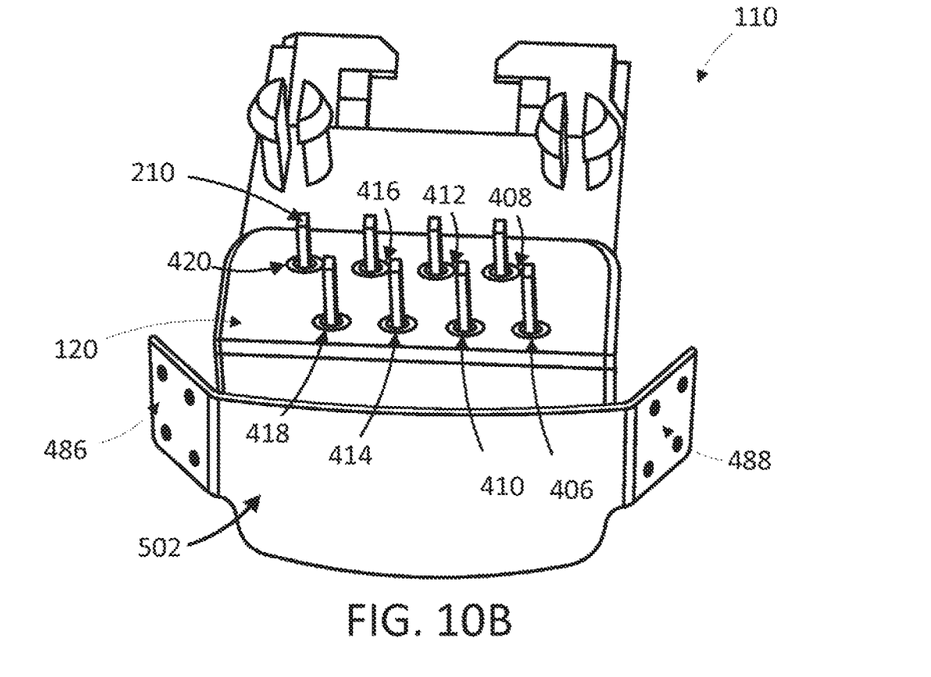
FIG. 10B illustrates a rear perspective view of another embodiment of the RJ45 jack of FIG. 1 with the shield removed.

FIG. 10 illustrates the PCB 120 positioned in the jack 110. The substrate 402 of the PCB 120 is made from a flexible material that allows a first portion of the PCB 120 to be oriented to a second portion of the PCB 120 by approximately a 90 degree angle. Accordingly, the PCB 120 is bent such that the vias 406, 408, 410, 412, 414, 416, 418 and 420 are positioned over the pins 210 in the jack, and the traces 422, 424, 426, 428, 430, 432, 434 and 436 extend from the vias 406, 408, 410, 412, 414, 416, 418 and 420 to the contact pads for the jack. The shielding tabs 486 and 488 are bent such that they are at approximately a 90 degree angle from the PCB 120. The shielding tabs 486 and 488 are positioned along the side of the jack such that the jack shield 130 of the jack engages the shielding tabs 486 and 488.

The flexible PCB 120 may be implemented using any flexible plastic substrates that enable the flexible PCB 120 to bend. As described herein, the flexible PCB 120 may flex or bend to conform to the existing form factor of the RJ45 jack 110 and be shielded by the jack shielding 130. For example, the flexible PCB 120 may be attached to the RJ45 jack 110, placed between the RJ45 jack 110 and the jack shield 130. The flexible PCB 120 shielding tabs 486 and 488 may be attached to the jack shield 130 to provide a common connection to the flex circuit on the flexible PCB 120. The set of pins 210 of the RJ45 jack 110 may then be electrically coupled to a circuit board of a device in which the RJ45 jack 110 is used.

The flexible PCB 120 may be configured to fold and conform to the shape of the RJ45 jack 110 for better fit into an existing enclosure such as the jack shield 130. For example, in one aspect of the disclosed approach, the flexible PCB 120 bends at an approximately 90 degree angle towards a middle section of the flexible PCB 120, to fold into the jack shield 130. The shielding tabs 486 and 488 of the flexible PCB 120 are folded onto and contacting the jack shield 130, may be soldered to secure the flexible PCB 120 to the jack shield 130. Those skilled in the art will recognize that the orientation of the flexible PCB 120 with respect to the RJ45 jack 110 within the jack shield 130 may vary in accordance with various aspects of the disclosure. For example, the flexible PCB 120 may be sufficiently thin to flex and fold into other sides of the jack shield 130. The flexible PCB 120 may be shaped to lie entirely along the bottom section 304 of the jack shield 130 without needing to flex or bend into the jack shield 130.

The preceding detailed description is merely some examples and embodiments of the present disclosure and that numerous changes to the disclose embodiments can be made in accordance with the disclosure herein without departing from its spirit or scope. The preceding description, therefore, is not meant to limit the scope of the disclosure but to provide sufficient disclosure to one of ordinary skill in the art to practice the invention with undue burden.

What is claimed:

1. A high speed communication jack including:
    a housing including a port for accepting a plug, the port including a plurality of pins each connected to a corresponding signal line in the plug;
    a shielding case surrounding the housing;
    a circuit board disposed in part between the shielding case and the housing, wherein the circuit board comprises a substrate having a first side and a second side opposite the first side,
    a plurality of pin vias extending through the substrate where each of the pin vias is configured to accommodate a pin on the housing,
    a plurality of traces on the first side of the substrate where each trace extends from a corresponding one of the plurality of pin vias;
    a shielding trace layer disposed on the first side of the substrate including a pair of shielding tabs disposed on opposite edges of the first side of the substrate and a shielding trace disposed on the first side of the substrate opposite the first plurality of pin vias where the shielding trace extends between and connects the shielding tabs,
    a first conductive layer between the first side and second side of the substrate;
    a third layer between the first conductive layer and the second side of the substrate, with the third layer having a signal return layer embedded in the first dielectric layer,
    a second conductive layer between the third layer and the second side of the substrate.

2. The jack of claim 1 wherein the signal return layer is separated from the first conductive layer by a distance D2.

3. The jack of claim 1 wherein the signal return layer is separated from the second conductive layer by a distance D3.

4. The jack of claim 1 wherein the first conductive layer, third layer and signal return layer form a capacitor.

5. The jack of claim 4 wherein the capacitor has a capacitance of between 0.1 pf and 0.5 pf.

6. The jack of claim 1 wherein a conductive material surrounds the periphery of each via on the first side and second side of the substrate.

7. The jack of claim 6 wherein the distance between the signal return layer and the first conductive layer is controlled to change the capacitance of a via capacitor formed by the conductive material surrounding each via the signal return layer.

8. The jack of claim 7 wherein the first conductive layer, third layer and signal return layer form a common mode filter.

9. The jack of claim 8 wherein the capacitance of the via capacitor is controlled to tune the common mode filter.

10. The jack of claim 1 wherein the via conductive material is made of gold or copper.

11. A method of making a high speed communication jack including the steps of:
    forming a housing including a port for accepting a plug, the port including a plurality of pins each connected to a corresponding signal line in the plug;
    forming a shielding case surrounding the housing;
    forming a circuit board disposed in part between the shielding case and the housing,
    wherein the circuit board comprises forming a substrate having a first side and a second side opposite the first side,
    forming a plurality of pin vias extending through the substrate where each of the pin vias is configured to accommodate a pin on the housing,
    forming a plurality of traces on the first side of the substrate where each trace extends from a corresponding one of the plurality of pin vias;

forming a shielding trace layer disposed on the first side of the substrate including a pair of shielding tabs disposed on opposite edges of the first side of the substrate and a shielding trace
disposed on the first side of the substrate opposite the first plurality of pin vias where the shielding trace extends between and connects the shielding tabs,
forming a first conductive layer between the first side and second side of the substrate;
forming a third layer between the first conductive layer and the second side of the substrate, with the third layer having a signal return layer embedded in the first dielectric layer,
forming a second conductive layer between the third layer and the second side of the substrate.

12. The method of claim 11 including the step of separating the signal return layer from the first conductive layer by a distance D2.

13. The method of claim 11 including the step of separating signal return layer from the second conductive layer by a distance D3.

14. The method of claim 11 wherein the first conductive layer, third layer and signal return layer form a capacitor.

15. The method of claim 14 wherein the capacitor has a capacitance of between 0.1 pf and 0.5 pf.

16. The method of claim 11 including the step of forming a conductive material that surrounds the periphery of each via on the first side and second side of the substrate.

17. The method of claim 16 including the step of controlling the distance between the signal return layer and the first conductive layer to change the capacitance of a capacitor formed by the conductive material surrounding each via the signal return layer.

18. The method of claim 17 wherein the first conductive layer, first dielectric layer and signal return layer form a common mode filter.

19. The method of claim 18 including the step of controlling the capacitance of the via capacitor to tune the common mode filter.

20. The method of claim 11 wherein the via conductive material is made of gold or copper.

* * * * *